United States Patent [19]

Petz et al.

[11] Patent Number: 4,969,790

[45] Date of Patent: Nov. 13, 1990

[54] APPARATUS ON THE CAROUSEL PRINCIPLE FOR THE COATING OF SUBSTRATES

[75] Inventors: Andreas Petz, Bruchkoebel; Dan Costescu, Hainburg, both of Fed. Rep. of Germany

[73] Assignee: Leybold Aktiengesellschaft, Hanau, Fed. Rep. of Germany

[21] Appl. No.: 261,743

[22] Filed: Oct. 24, 1988

[30] Foreign Application Priority Data

Aug. 12, 1987 [DE] Fed. Rep. of Germany ....... 3827343

[51] Int. Cl.⁵ .............................................. B65G 49/05
[52] U.S. Cl. .................................... 414/217; 414/331; 414/225; 414/222; 118/719; 118/729; 118/730; 118/500; 204/298
[58] Field of Search ................ 414/217, 222, 225, 226, 414/331, 416, 417, 786; 118/719, 50.1, 50, 730, 500; 204/298

[56] References Cited

U.S. PATENT DOCUMENTS

| | | | |
|---|---|---|---|
| 3,776,830 | 12/1973 | Endo . | |
| 4,336,438 | 6/1982 | Uehara et al. | 414/222 X |
| 4,378,189 | 3/1983 | Takeshita et al. | 414/225 |
| 4,388,034 | 6/1983 | Takahashi | 414/331 |
| 4,465,416 | 8/1984 | Burkhalter et al. | 414/217 |
| 4,501,527 | 2/1985 | Jacoby et al. | 414/225 |
| 4,501,766 | 2/1985 | Suzuki et al. | 118/729 X |
| 4,553,069 | 11/1985 | Purser | 414/225 X |
| 4,646,681 | 3/1987 | Fujiyama | 118/729 X |
| 4,664,578 | 5/1987 | Kakehi | 414/217 |
| 4,746,256 | 5/1988 | Boyle et al. | 414/225 X |
| 4,759,681 | 7/1988 | Nogami | 118/730 X |

FOREIGN PATENT DOCUMENTS

| | | | |
|---|---|---|---|
| 3507337 | 9/1985 | Fed. Rep. of Germany . | |
| 58-77239 | 5/1983 | Japan . | |
| 60-24370 | 2/1985 | Japan . | |
| 1163268 | 7/1986 | Japan | 118/730 |
| 2116769 | 5/1987 | Japan | 118/719 |
| WO87/04414 | 7/1987 | PCT Int'l Appl. | 414/217 |
| 2171119 | 8/1986 | United Kingdom . | |

*Primary Examiner*—Frank E. Werner
*Attorney, Agent, or Firm*—Felfe & Lynch

[57] ABSTRACT

Apparatus for the coating of substrates in a vacuum chamber is disclosed wherein a rotatable substrate holder bears a plurality of substrate receivers adapted to transport a like number of substrates (26, 26', etc.) stepwise on a circular path from one of two lock stations (8, 9) through an associated coating station (10, 11) and back to the same respective lock station.

Each lock station has one transfer device comprising a rotating substrate plate bearing substrate receivers (85, 85', etc. and 86, 86', respectively). Each plate cooperates with four magazines (18, 18', etc. and 19, 19', etc., respectively). Each magazine is equipped with at least two stacks (25, 25', etc., and 27, 27', etc., respectively) of substrates (26, 26', etc.). A rotating device (28, 28', etc. and 29, 29', etc., respectively) cooperates with each of the magazines (18, 18', etc. and 19, 19', etc., respectively) and transports the substrates (26, 26', etc.) between the magazines (18, 18', etc. and 19, 19', etc., respectively) and the substrate receivers (85, 85', etc. and 86, 86', respectively) of the substrate plates (20a, 21a).

14 Claims, 7 Drawing Sheets

APPARATUS ON THE CAROUSEL PRINCIPLE FOR THE COATING OF SUBSTRATES

BACKGROUND OF THE INVENTION

1. Field of the Invention

The invention relates to an apparatus on the carousel principle for the coating of substrates, having a vacuum chamber and a revolving substrate holder disposed therein More particularly the substrate holder is one, which bears a plurality of substrate receivers at uniform intervals and in a circular array and by which a like number of substrates can, by means of a drive, be transported step-wise on a circular path from two lock stations through associated coating stations and back to the respective lock station. The step width of the drive and the angular position of each coating station are selected so that one and the same coating station is associated by the stepping movement of one particular substrate receiver with one and the same lock station.

On account of the stop made between steps to permit passage in and out of an air lock, as well as the stationary coating process, the operation of such an apparatus can be considered to be quasi-continuous.

2. Discussion of Related Art

U.S. Pat. No. 3,652,444 discloses an apparatus of the kind described above, which has three coating stations but only one lock station. The known apparatus is designed for the manufacture of semiconductors and the various coating stations in this case usually serve for the application of a whole series of coatings. The coating stations can be preceded and followed by other treatment stations in which other treatments are performed as necessary for the pretreatment and post-treatment of semiconductors. For a given arc diameter and corresponding investment costs, however, the throughput is limited, if only because the entry into and exit from the lock, including the evacuation of the lock chamber, require a certain amount of time.

There are a number of coating tasks and products in which the coating process itself and/or the pretreatments and/or after treatments require a lesser amount of time, so that the use of the known apparatus for such processes or products would be extremely uneconomical. An example of such a product is the so-called compact disk, which is to be provided on only one side with a single coating of a quickly applied, highly reflective metal such as aluminum.

Also important in the operation of such apparatus are the so-called loading stations which permit a fully automatic loading and unloading of such apparatus. Such loading stations, in connection with the corresponding magazine stations, are relatively complex and their cycle frequency cannot be fully utilized because of the relatively slow operation of the known apparatus.

SUMMARY OF THE INVENTION

The invention is therefore addressed to the problem of improving an apparatus of the kind described above so that the throughput can be substantially increased and so-called dead time due to the filling and emptying of the magazine stations can be avoided.

This problem is solved in accordance with the invention by associating a transfer system with each of the two lock stations, each transfer system being associated with a revolving substrate plate with substrate receivers, each substrate plate cooperating with a plurality of magazines, each having at least two stacks of substrates, and a rotating device or substrate shifting device cooperating with each of the magazines and transporting the substrates from the magazines to the substrate receivers of the substrate plates, or vice versa.

Preferably, transfer systems cooperate with both lock stations, and with the transfer systems are associated substrate plates revolving about the axes of rotation and having each a plurality of substrate receivers to accommodate substrates, the substrate receivers being disposed along an arc at uniform intervals from one another, and being moved step-wise by means of a drive.

DETAILED DESCRIPTION OF THE PREFERRED EMBODIMENT

Figure 1:
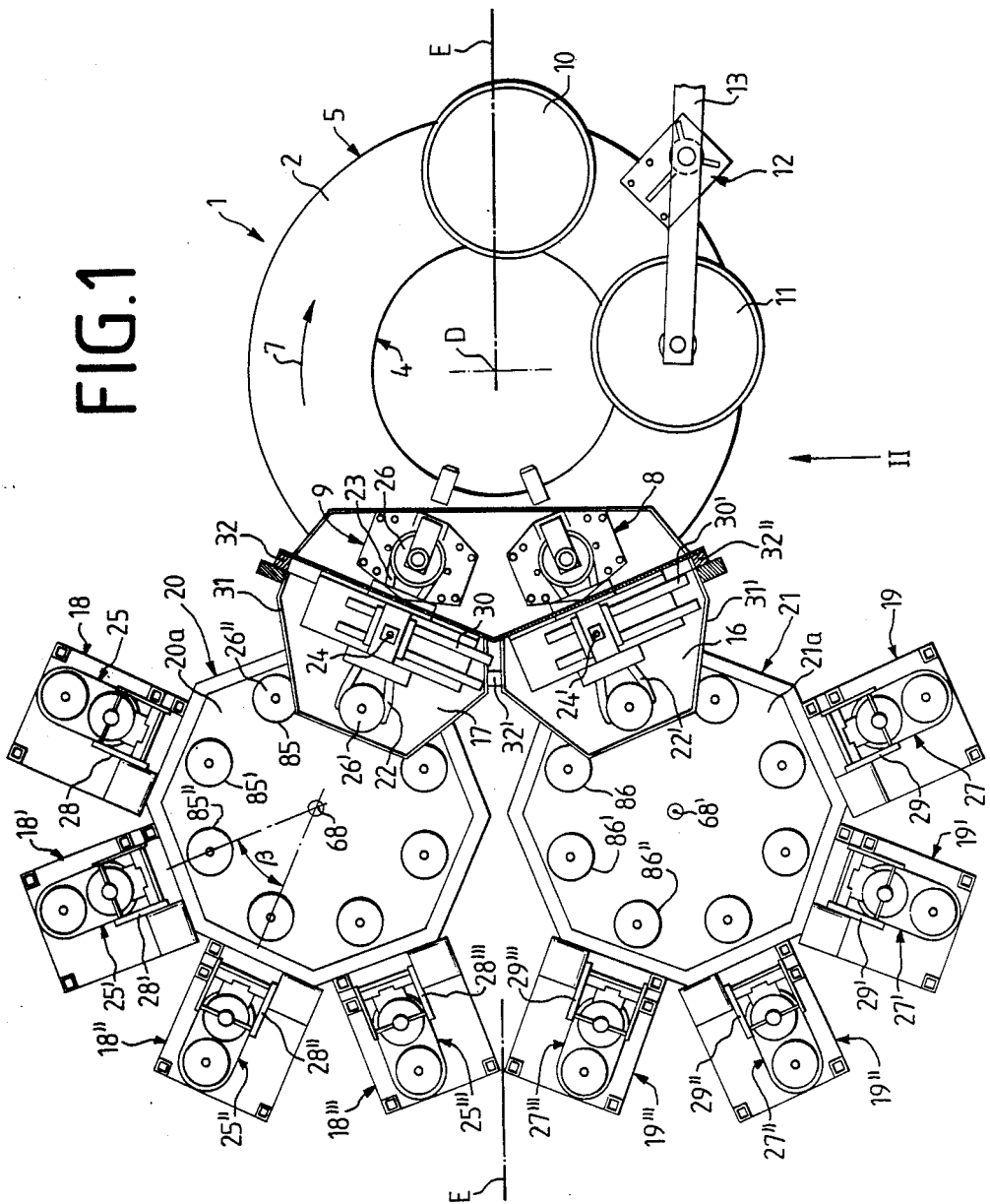
FIG. 1 is a top plan view of a complete apparatus in accordance with the invention.

In FIG. 1 is shown a vacuum chamber 1 whose outer surface can be described as formed by a shallow hollow cylinder, i.e., an upper annular chamber roof 2 and a congruent annular chamber floor 3 are joined together by an inner ring 4 and an outer ring 5. The very shallow dimensions of the vacuum chamber are apparent particularly in FIG. 2. Inside of the vacuum chamber 1 a likewise annular substrate holder 6 (FIG. 3) housed rotatably and connected to a drive, and will be further discussed in connection with FIGS. 3 and 4. The arrangement, however, does not have to be annular in plan, and instead the vacuum chamber can be of cylindrical configuration.

The direction of the transport of the substrates is indicated by the arrow 7. The vacuum chamber 1 is equipped with two identical lock stations 8 and 9 which will be discussed in detail in conjunction with FIG. 4. Furthermore, two coating stations 10 and 11 are disposed on top of the vacuum chamber 1.

A lifting mechanism 12 is associated with the coating stations 10 and 11. It consists of a swiveling boom 13, a guide tube 14 and a lifting cylinder 15 and is intended to permit changing the cathodes. As shown especially in FIG. 1, a loading station 16 and 17 and four magazines 18, 18', 18'', 18''' and 19, 19', 19'', 19''', respectively, are associated with each lock station 8 and 9. Between each loading station 16 and 17 and the magazines 18, 18', etc. and 19, 19', etc., respectively, there is a transfer system 20 and 21 and a rotating substrate plate 20a and 21a, respectively.

Each loading station 16, 17, has two grippers 22, 23, and 22' and 23', respectively, which are fastened on a common shaft 24, 24', [and point] in diametrically opposite directions. The shaft 24, 24', is situated in such a position with respect to the transfer system 20 and 21, respectively, on the one hand, and to the lock station 8 and 9, on the other hand, that by means of the one gripper 23, 23', a substrate 26, 26', situated above the lock station 9, can be selectively picked up or laid down while at the same time a substrate 26'', 26''', situated above the transfer system 20, can also be picked up or laid down by means of the other gripper 22, 22'.

Figure 5:
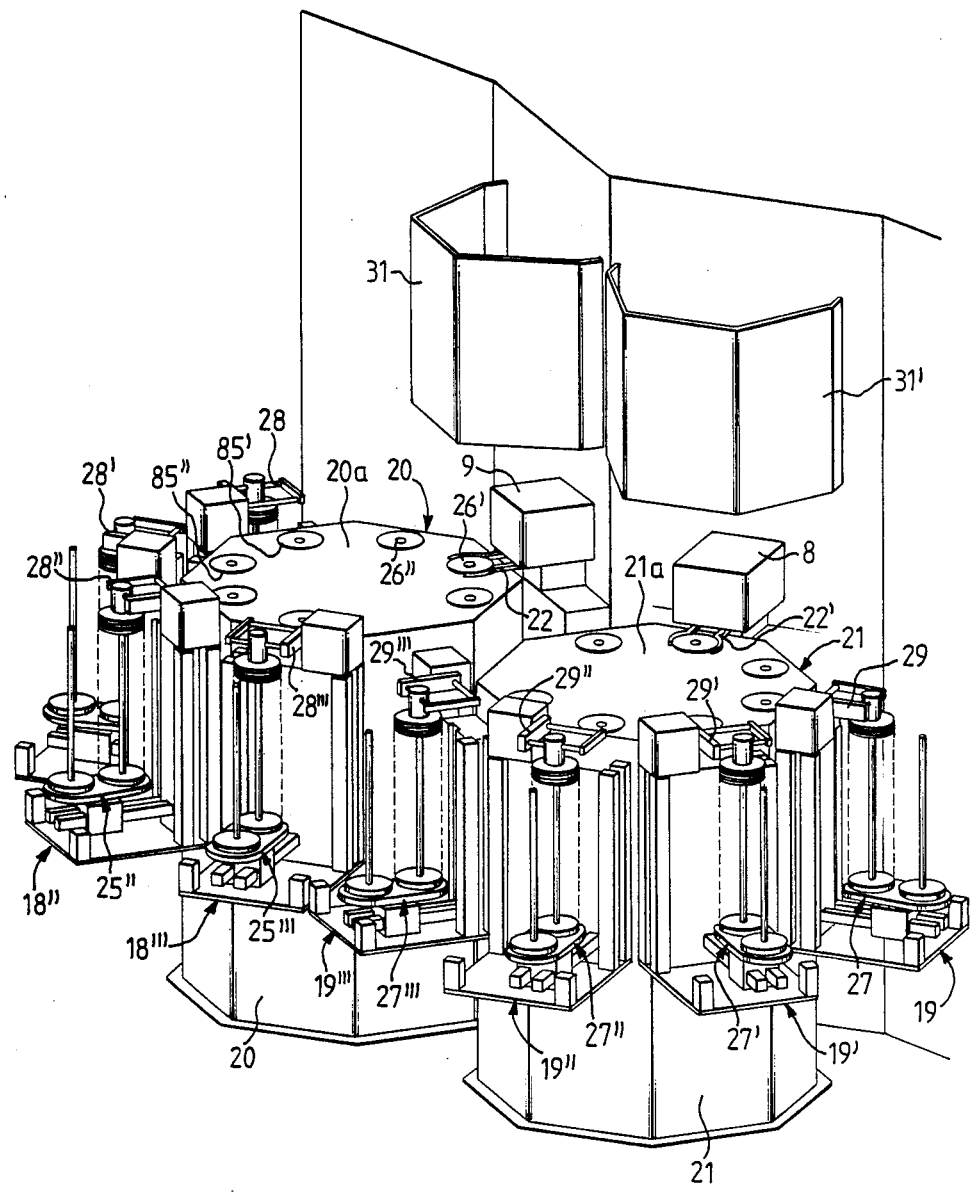
FIG. 5 is a perspective view of the entire apparatus, looking at the two transfer systems with appended magazines.
Figure 6:
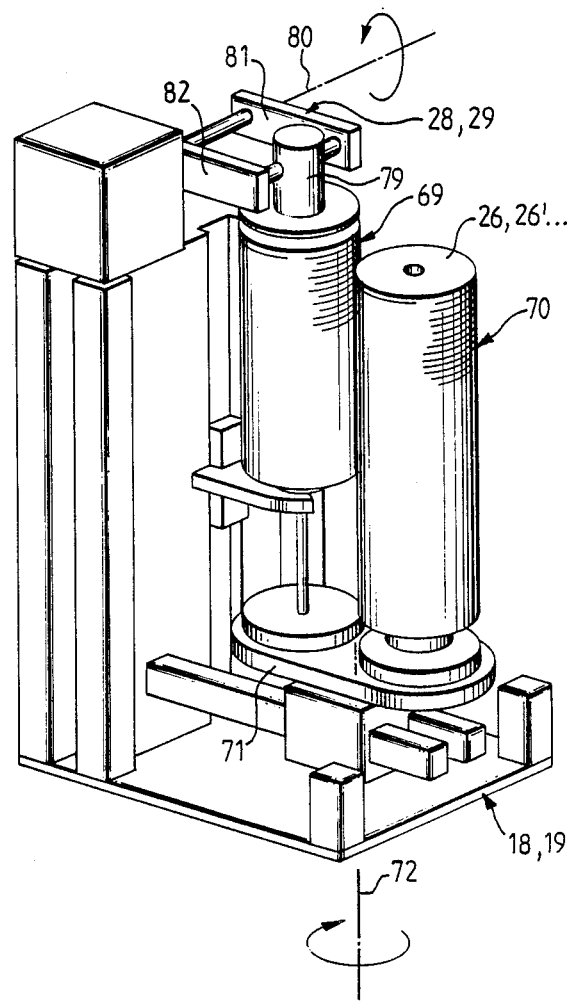
FIG. 6 is an enlarged view of a magazine with two stacks of substrates and a rotating device in accordance with FIG. 5.

Referring also to FIGS. 5 and 6, each magazine 18, 18', ...has a respective carousel 25,25',...in which two stacks 69, 70 of substrates 26, 26', etc. are contained. Each magazine 19, 19'... has a carousel 27, 27'... in which two stacks 69, 70 of substrates 26, 26'.. are likewise contained. Each magazine 18 and 19 also has a pivotable substrate pick-up device 28, 28', etc. and 29, 29', etc.

In regard to the pivotal movement of the grippers 22, 22', and 23, 23', two shock dampers 30, 30', are associated with each of their shafts 24, 24'. The loading stations 16 and 17 are surrounded by shields 31, 31', and the entire system is of a mirror image symmetry with regard to a vertical plane of symmetry E—E (FIG. 1).

Figure 2:
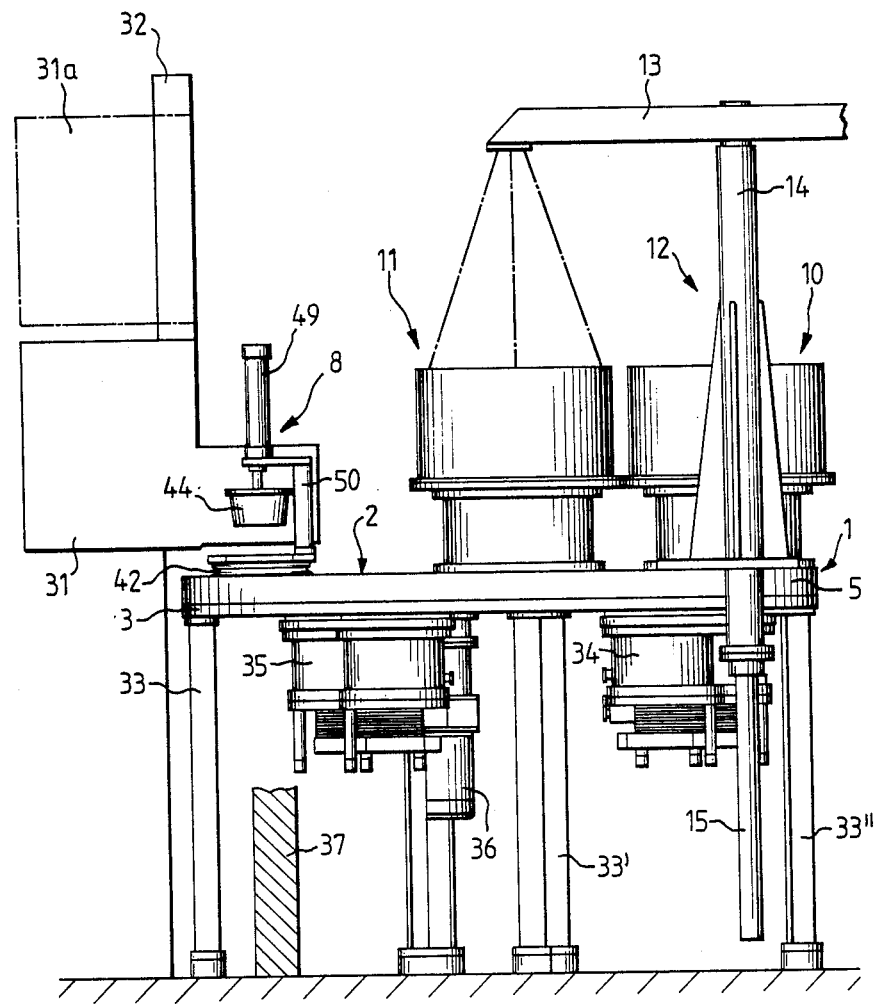
FIG. 2 is a front view of the coating apparatus of FIG. 1 seen in the direction of arrow II.
Figure 3:
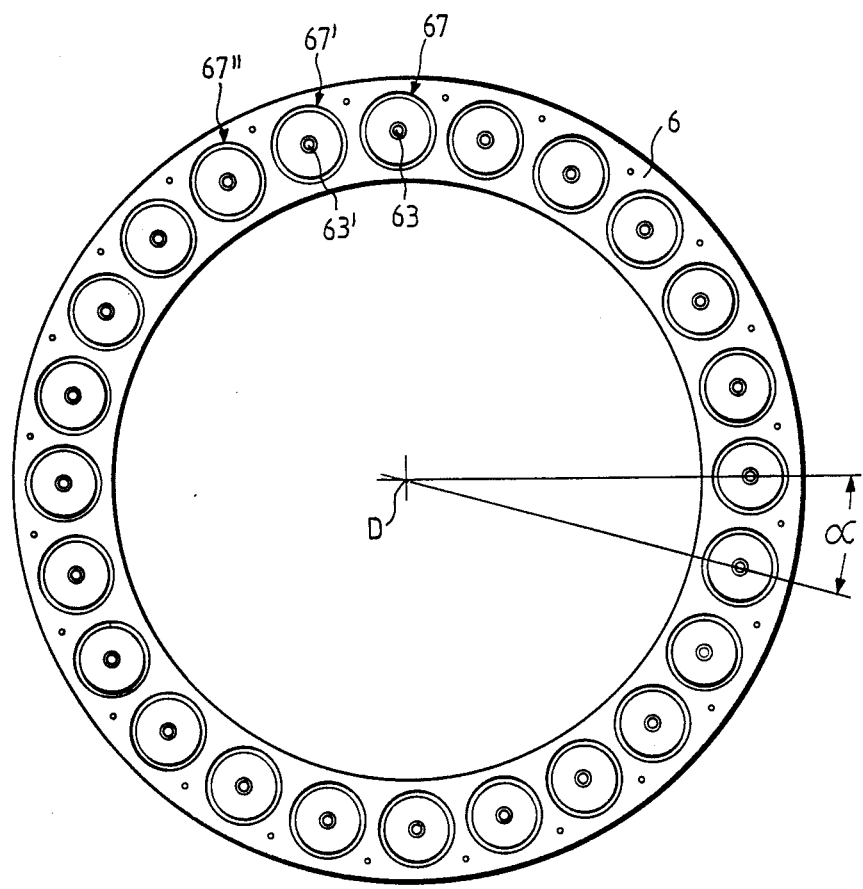
FIG. 3 is a top plan view of the substrate holder of the coating apparatus.

As it is still further apparent from FIG. 2, the guard 31 can be lifted by means of the guide rails 32, 32', 32'' from the position shown in solid lines to position 31a represented in broken lines, to permit access to the loading station. The vacuum chamber 1 rests in supports 33, 33', etc. Turbomolecular pumps 34 and 35 are connected to the vacuum chamber 1, and for the stepping of the substrate holder 6, a motor 36 is provided. The wall section 37 symbolically represents the wall of a clean room.

Figure 4:
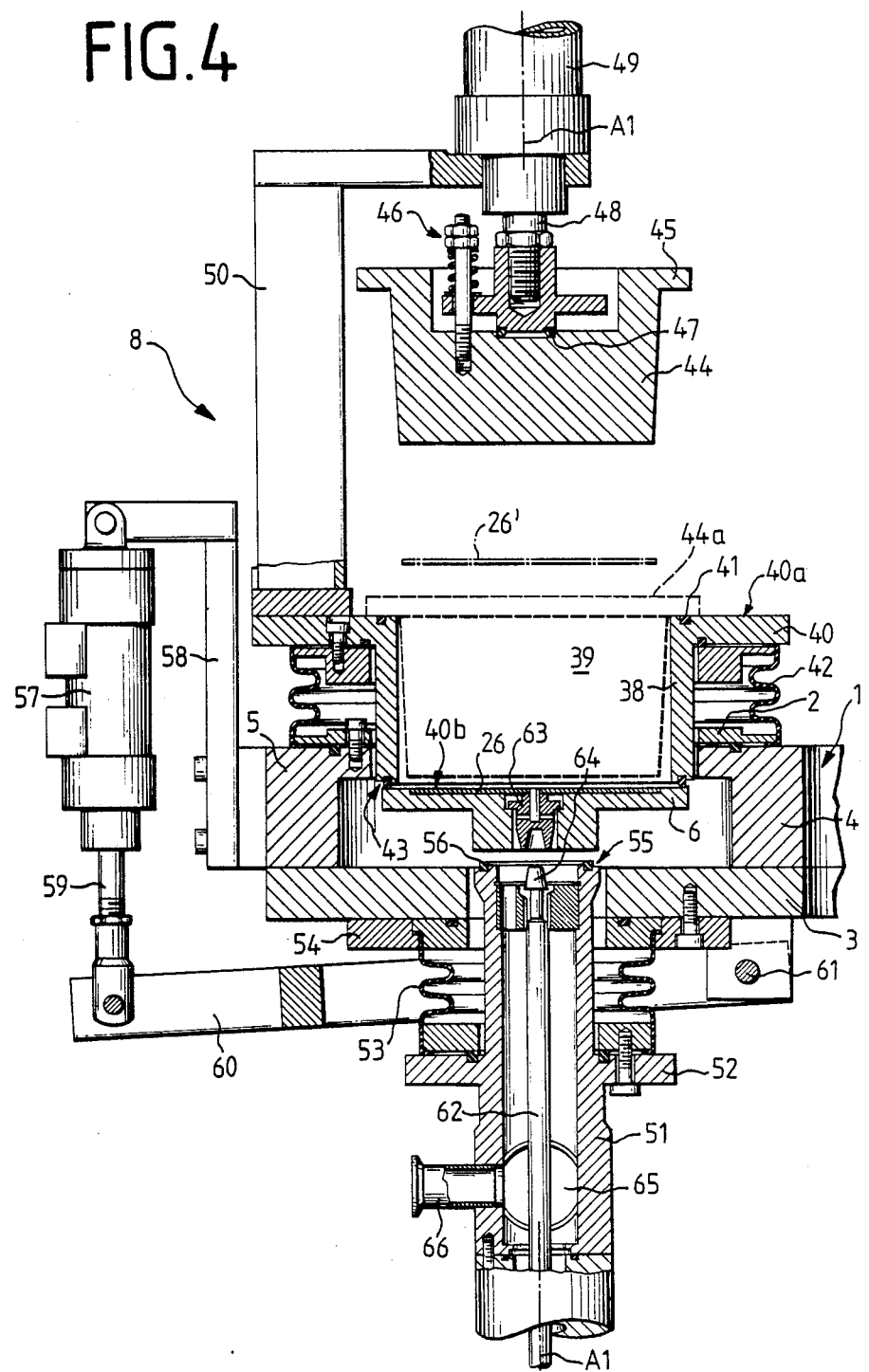
FIG. 4 is an enlarged vertical section through one of the two lock stations of the coating apparatus.

Details of the vacuum chamber 1 can be more easily understood in FIG. 4, namely the chamber roof 2, the chamber floor 3 and the rings 4.and 5. In the chamber roof 2 is a cylindrical opening through which the upper part 38 of the lock chamber passes with sufficient radial clearance.

The upper part 38 of the lock chamber has a cylindrical interior and, at the upper end, a flange 40 with a sealing surface 40a into which a sealing ring 41 is laid. The upper part 38 is connected vacuum-tight to the vacuum chamber 1 by a bellows 42. The upper part 38 also has a bottom sealing surface 40b into which another sealing ring 43 is laid.

Also part of each lock station 8 and 9 is a displacing body 44 which is associated with the upper part 38 of the lock chamber, is power-driven, and has a sealing rim 45, and largely fills the cylindrical interior 39. The displacing body is connected by an adjusting means 46 having a pair of balls 47, to a piston rod 48 pertaining to a driving cylinder 49. The latter in turn is connected by a post 50 to the flange 40, so that a perfect centering of the displacing body 44 on the axis $A_1$—$A_1$ of the entire lock station is assured. By means of the working cylinder 49 the sealing rim 45 can be placed vacuum-tight onto the top sealing surface 40a and the sealing ring 41 of the upper part of the lock chamber.

Between the flange 40 and the vacuum chamber 1 there is also a drive, here not visible, by which the bottom sealing surface 40b of the upper part 38 is placed sealingly on top of the substrate holder 6.

Furthermore, each of lock stations 8 and 9 has a lock chamber stem 51 which is in the form of a hollow tubular body and has a mounting flange 52 for another bellows 53 which concentrically surrounds the stem 51 and connects it vacuum-tight to the chamber floor 3. A collar ring 54 serves to connect it to the chamber bottom.

The stem 51 has an upper sealing surface 55 into which is laid a sealing ring 56. With the interposition of the bellows 53 the stem 51 is brought through the chamber floor 3 with limited freedom of movement in the direction of the axis $A_1$—$A_1$. The coaxial vertical movement is produced by a drive cylinder 57 which is fastened by a post 58 to the vacuum chamber 1, and whose piston rod 59 acts on the one end of a forked rocker 60 whose other end is connected by a pivot 61 to the chamber floor 3. Between the point of engagement of the piston rod 59 and the pivot 61 the rocker 60 is connected by an additional linkage, here not represented, to the lock chamber stem 51, so that when the cylinder 57 is actuated the stem 51 can be raised or lowered. In the interior of the lock chamber stem 51 is a lift rod 62 which can be raised upward above the sealing surface 55 and can be brought into engagement with a substrate receiver 63 which is engaged in a concentric hole in the substrate 26.

By means of the lift rod 62 and the substrate receiver 63 the substrate 26 can be moved between the position represented in solid lines and the position represented in broken lines. In the first-named position the substrate 26 rests in a shallow cylindrical recess in the substrate holder 6, the substrate receiver 63 having a flange which rests on a shoulder, of the substrate holder 6. In this position the substrate 26 can be transported step by step through the vacuum chamber 1. The lift rod 62 connects with the substrate receiver 63 when the lift rod 62 is raised by means of a centering cone 64 which engages a complementary bore in the substrate receiver 63. The raised position of the substrate 26' is the position wherein the substrate is turned to the axis $A_1$—$A_1$ and back again by means of the grippers 22, 22' and 23, 23' (see FIG. 1). The lock chamber stem 51 is connected by a suction connection 65 to a vacuum pump and can be vented through a flooding line 66.

On FIG. 4 it should also be added that the indicated positions of displacing body 44 on the one hand and lock chamber upper part 38 and lock chamber stem on the other do not occur simultaneously during operation. The indicated positions of upper part 38 and stem 51 relative to the substrate holder 6 are possible only when the displacing body 44 is in the position shown in broken lines, i.e., sealed against the upper part 38. If the displacing body 44 on the other hand is in the raised position 44, the sealing surfaces 40b and 55 must lie against the substrate holder 6 to prevent the entry of ambient air into the vacuum chamber. The manner of the operation of the apparatus will now be explained:

Each of the recesses 67, 67', etc. substrate holder 6 is loaded with substrates 26, 26', etc. by means of the two lock stations 8 and 9, namely, by means of lock station 8 the first, third, fifth, seventh, etc. recesses are provided with a substrate, while by means of lock station 9 the second, fourth, sixth, eighth, etc. recesses are provided with a substrate. The substrates lying in the odd-numbered recesses on the one hand and in the even-numbered recesses on the other constitute each a series. The insertion of substrates 26, 26', etc. is performed as follows: a gripper 22, 22', receives a substrate from its corresponding transfer system 20 and 21, and after rotating about the axis of rotation 24, brings it into the position represented in broken lines in FIG. 4. When each substrate is in this position the substrate receiver 63, raised by the lift rod 62, penetrates with an annular prolongation from below into a circular center opening in the substrate and holds the latter reliably fast.

At this moment the gripper of the loading station releases the substrate, which is now brought by a lowering movement of the lift rod 62 to the position represented in solid lines in FIG. 4. Immediately after the substrate 26 comes to rest in the recess 67 in the substrate holder 6, the substrate receiver 63 sets itself down on the annular shoulder of the substrate holder 6, and the centering cone 64 separates from the substrate receiver 63. There is a gasket 43 between the substrate holder 6 and the upper part 38 of the lock chamber, on the one hand, and a gasket 56 between the holder 6 and the lock chamber stem 51 on the other. Immediately after the substrate 26 has been lowered, the displacing body 44 is introduced into the interior 39 above the substrate 26 (position represented in broken lines), resulting in a seal between the sealing surface 40a and the sealing margin 45. Now, with the vacuum pump steadily running, the upper part 39 of the lock chamber is raised and the lock chamber stem 51 is lowered. This position is represented in FIG. 4. Now the apparatus is in an operating condition in which the substrate holder 6 can be advanced one step, i.e., two division angles.

As soon as the substrate 26 in question arrives in the course of its step-wise progression at the coating station 10 and has come to a stop therein, the substrate is coated with the material originating from a target.

At the end of the coating process the substrate 26 is again advanced step-wise with the substrate holder 6 until the fully coated substrate comes back to the same lock station 8. The exit of the substrate through the lock takes place precisely in the reverse of the entry, i.e., first the substrate holder 6 is sealed against the lock chamber upper part 38 and the stem 51, then the interior 39 is flooded, and the displacing body 44 is raised. Immediately afterward the substrate 26 is also lifted by the lift rod 62 to the position indicated in broken lines and seized by one of the grippers 22, 22' and 23, 23', and rotated out of reach about the axis $A_1$–$A_1$. Immediately afterward a new, still-uncoated substrate is rotated by the rotation of the grippers about the axis 24 to the same position, whereupon the entry through the lock is repeated in the manner described above.

As FIG. 1 shows, each transfer system 20, 21, has eight receivers 85, 85', etc. and 86, 86', ..., respectively, for eight substrates 26, 26', etc., the substrate plates 20a and 21a which are mounted for rotation each about the axes 68, 68', advance in each working cycle by one substrate position, i.e., by the angle $\beta$.

In each cycle, the rotating devices 28, 29, or the rotating devices 28', 29', place substrates 26, 26', etc. onto the substrate plates 20a, 21a, while the rotating devices 28'', 29'', and 28''', 29''', pick up substrates 26, 26', etc. from the substrate plates 20a, 21a, and lay them each time on one of the stacks 69, 70, of the magazines 25'', 25''', and 27'', 27''', respectively. Instead of one magazine type with two disk stacks 69, 70, each, disposed one behind the other and held on a carrier 71 for rotation about an axis 72, a magazine can also be used of the, type represented in FIG. 7, whose two disk stacks 77', 78, each disposed in a vertically displaceable single magazine.

Figure 7:
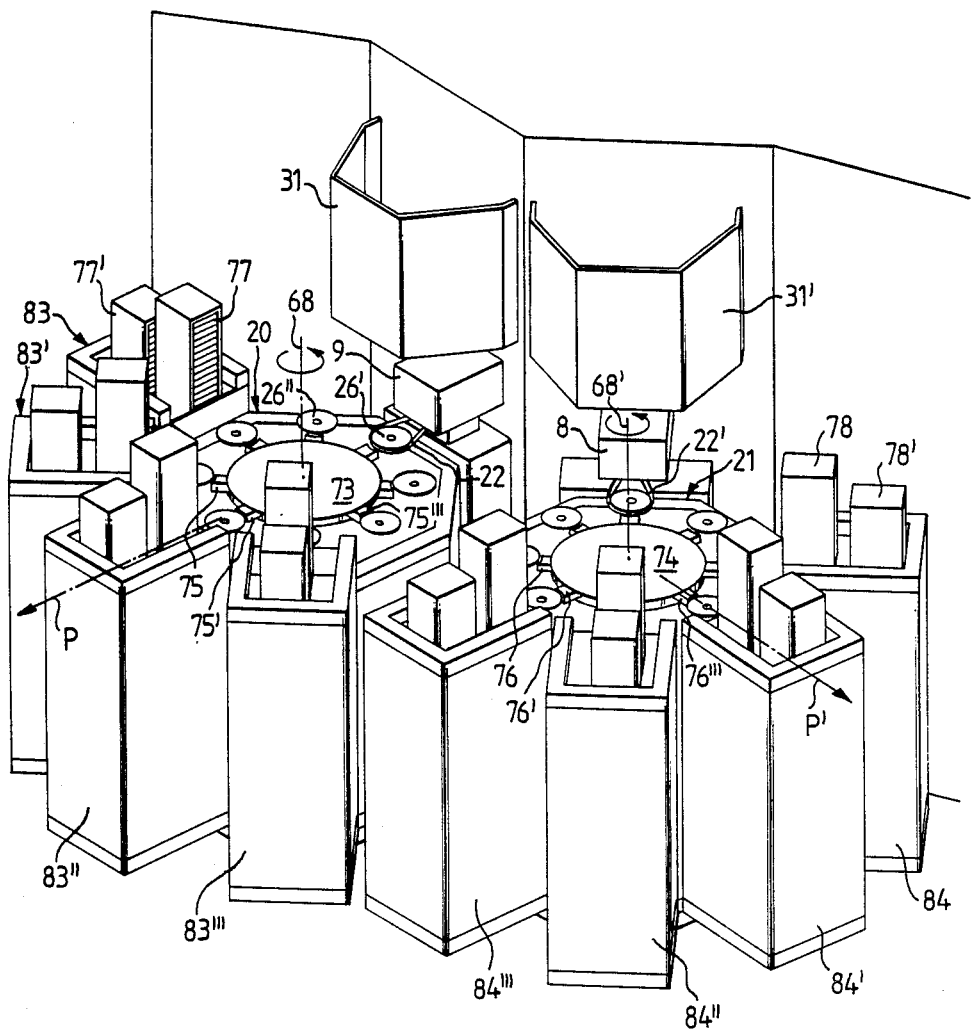
FIG. 7 is a perspective view of an apparatus similar to the one in FIG. 5, but with cassette magazines.

FIG. 7 shows an apparatus with vertically displaceable single magazines and with two transfer systems 20, 21, in which, instead of rotating devices, substrate shifting means 73, 74, are provided above the substrate plates 20a, 21a, and are equipped with arms 75, 75', etc. and 76, 76', etc. moving in a horizontal plane, which move the substrates 26, 26', etc. into and out of the disk stacks 77, 77', etc. and 78, 78', etc. According to whether the inside disk stack 77 or 78, the outside disk stack, 77', 78' is to be operated, the corresponding are 75, 75', etc. and 76, 76', etc. runs further or not so far in the radial direction P, P', from the substrate shifting means 73 and 74, respectively.

What is claimed is:

1. Apparatus based on the carousel principle for the coating of substrates, said apparatus including a substrate holder rotatably disposed in a vacuum chamber, said substrate holder having a plurality of first substrate receivers arranged at uniform intervals in a circular array, said apparatus comprising:

more than one vacuum lock station, said substrate holder having means for moving said receivers on a circular path in the vacuum chamber from a lock station through an associated coating station and back to the same lock station, the step width of the movement and the angular position of each coating station being so selected that one and the same coating station is associated through the sep-wise movement of one particular substrate receiver with one and the same lock station;

one transfer device associated with each lock station, each transfer device having a rotatable substrate plate with a plurality of second substrate receivers;

a plurality of magazines cooperating with each substrate plate, each of said magazines being adapted to have at least two stacks of substrates;

means for transporting the substrates between the magazines and said second substrate receives; and means for transferring the substrates from the second substrate receives to the lock station.

2. Apparatus in accordance with claim 1, wherein said second substrate receivers are arranged at uniform intervals from one another along an arc and adapted to be moved in a step-wise fashion.

3. Apparatus in accordance with claim 1, wherein several magazines are associated with each transfer device and wherein a turning device associated with each magazine transports the substrates between the magazine and said second substrate receiver, said turning device having gripping means that are rotatable about a horizontal axis and a suction head adapted for raising and lowering the substrates.

4. Apparatus in accordance with claim 1, wherein said means for transporting the substrates between the magazines and said second substrate receivers comprises arms movable in a plane parallel to the plane of the substrate plates in a radial direction away from the axes of rotation of the respective transfer device all the way to the substrate stacks of the magazines and means for picking up the substrates at the free ends of said arms.

5. Apparatus in accordance with claim 1, wherein the parts of the apparatus which produce the transport of the substrates are electrically centrally controlled so that they are synchronous and in phase.

6. Apparatus in accordance with claim 1, wherein movement of the means for transporting substrates from the magazines to said second receivers takes place in a step-wise fashion and synchronously with the movement of the substrate holder.

7. Apparatus based on the carousel principle for the coating of substrates, comprising
a vacuum chamber;
a substrate holder rotatably disposed in said chamber, said holder having thereon a plurality of first substrate receivers at uniform intervals in a circular array;

a pair of lock stations on said vacuum chamber for transferring substrates to said receivers on said substrate holders;

a pair of coating stations for coating substrates on said holder in said chamber;

drive means for rotating said substrate holder step-wise, the step width of the drive and the angular position of the coating stations being selected so that each coating station is associated with substrate receivers from one and the same lock station, each receiver being transported from a lock station through the associated coating station and back to the same lock station;

a rotatable substrate plate associated with each lock station, each substrate plate having a plurality of second substrate holders;

a transfer device associated with each lock station for transferring thereto a substrate from the associated substrate plate, a plurality of magazines associated with each substrate plate, each magazine carrying a stack of substrates;

transport means for transporting the substrates from the magazine to a second receiver on the associated plate and vice versa.

8. Apparatus as in claim 7 wherein said transport means comprises a transport device associated with each magazine.

9. Apparatus as in claim 8, wherein each said transport device comprises a pair of arms that are pivotable about a horizontal axis, and a suction head for picking up the substrates.

10. Apparatus as in claim 8 wherein each magazine carries two stacks of substrates and is rotatable about an axis so that either stack can be positioned for transport.

11. Apparatus as in claim 7 wherein said transport means comprises a transport device associated with each second substrate received.

12. Apparatus as in claim 11 wherein each magazine carries two vertically displaceable stacks of substrates, said stacks of each magazine being radially oriented with respect to the associated rotatable substrate plate, each transport device being radially movable to reach either stack.

13. Apparatus as in claim 7 wherein said second substrate receivers are located at uniform intervals in a circular array, said apparatus further comprising drive means for rotating each said plate step-wise to deliver said substrates to the associated transfer device.

14. Apparatus as in claim 13 wherein the substrate holder, the transfer devices, the substrate plate, and the transport means are operated centrally so that their movements are synchronous and in phase.

* * * * *

UNITED STATES PATENT AND TRADEMARK OFFICE
CERTIFICATE OF CORRECTION

PATENT NO. : 4,969,790

DATED : November 13, 1990

INVENTOR(S) : Petz et al.

It is certified that error appears in the above-identified patent and that said Letters Patent is hereby corrected as shown below:

Column 1, line 10, after "therein" insert -- . --.

Column 5, line 66, delete "75, 75" and insert -- 75, 75' --.

Column 5, line 60, delete "77', 78" and insert -- 77, 77' --.

Column 6, line 21 (Claim 1) delete "sep-wise" and insert -- step-wise --.

Column 6, line 61 (Claim 6) after "second" insert -- substrate --

Signed and Sealed this

Twentieth Day of October, 1992

*Attest:*

DOUGLAS B. COMER

*Attesting Officer*     *Acting Commissioner of Patents and Trademarks*